(12) United States Patent
Suzuki et al.

(10) Patent No.: US 9,305,953 B2
(45) Date of Patent: Apr. 5, 2016

(54) IMAGING DEVICE AND IMAGING SYSTEM

(71) Applicant: CANON KABUSHIKI KAISHA, Tokyo (JP)

(72) Inventors: Kentarou Suzuki, Kawasaki (JP); Tomoyuki Tezuka, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/579,969

(22) Filed: Dec. 22, 2014

(65) Prior Publication Data

US 2015/0206913 A1 Jul. 23, 2015

(30) Foreign Application Priority Data

Dec. 25, 2013 (JP) ................................. 2013-267139

(51) Int. Cl.
| H04N 5/335 | (2011.01) |
| H01L 27/146 | (2006.01) |
| H04N 5/369 | (2011.01) |
| H04N 5/225 | (2006.01) |

(52) U.S. Cl.
CPC .... *H01L 27/14623* (2013.01); *H01L 27/14607* (2013.01); *H01L 27/14636* (2013.01); *H04N 5/2254* (2013.01); *H04N 5/369* (2013.01)

(58) Field of Classification Search
CPC .............................. H04N 5/335; H04N 5/374
See application file for complete search history.

(56) References Cited

U.S. PATENT DOCUMENTS

| 5,306,648 A * | 4/1994 | Fukaya ............... H01L 27/1443 257/E27.132 |
| 2008/0135844 A1* | 6/2008 | Yamazaki ......... H01L 29/66757 257/59 |
| 2014/0175592 A1* | 6/2014 | Iwabuchi ............ H01L 27/1464 257/443 |

FOREIGN PATENT DOCUMENTS

| JP | 2004-273566 A | 9/2004 |
| JP | 2009-218374 A | 9/2009 |
| JP | 2010-135842 A | 6/2010 |
| JP | 2010-267675 A | 11/2010 |

\* cited by examiner

*Primary Examiner* — James Hannett
(74) *Attorney, Agent, or Firm* — Canon USA Inc. IP Division

(57) ABSTRACT

An imaging device includes a light-sensing pixel region; a first pixel region; a second pixel region; a first wiring layer disposed above the light-sensing pixel region; and a second wiring layer disposed above the topmost wiring layer of the wiring layer disposed above the light-sensing pixel region, above the second pixel region. The first pixel region is disposed between the light-sensing pixel region and the second pixel region, adjacent to the light-sensing pixel region and the second pixel region, wherein the first pixel region overlaps, in plan view, a first shielding portion included in the first wiring layer. The second pixel region overlaps, in plan view, a second shielding portion included in the second wiring layer. An electroconductive pattern is formed at the first wiring layer at a position overlapping the second pixel region in plan view.

12 Claims, 10 Drawing Sheets

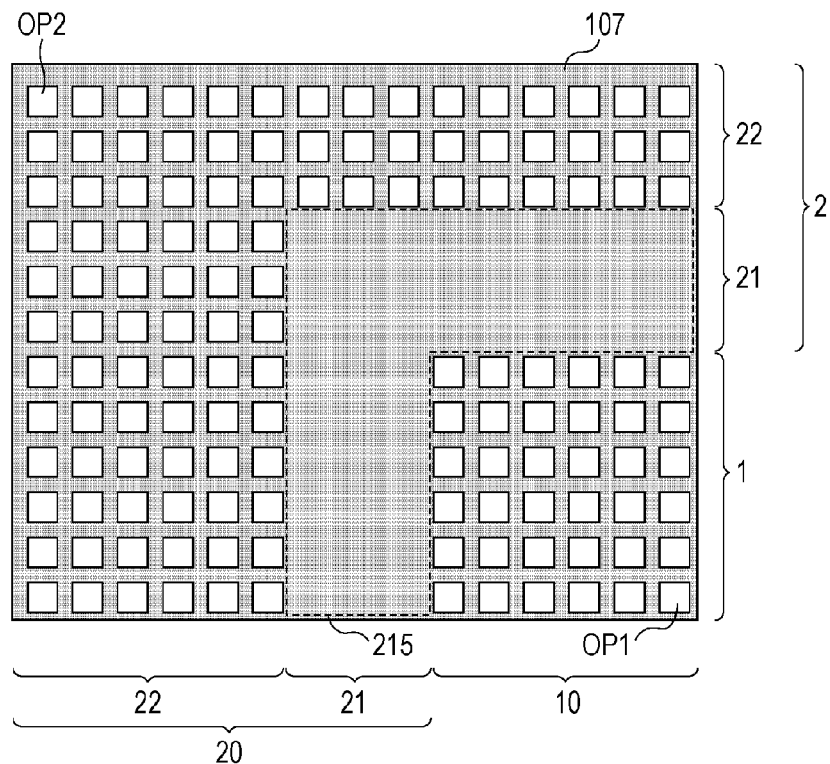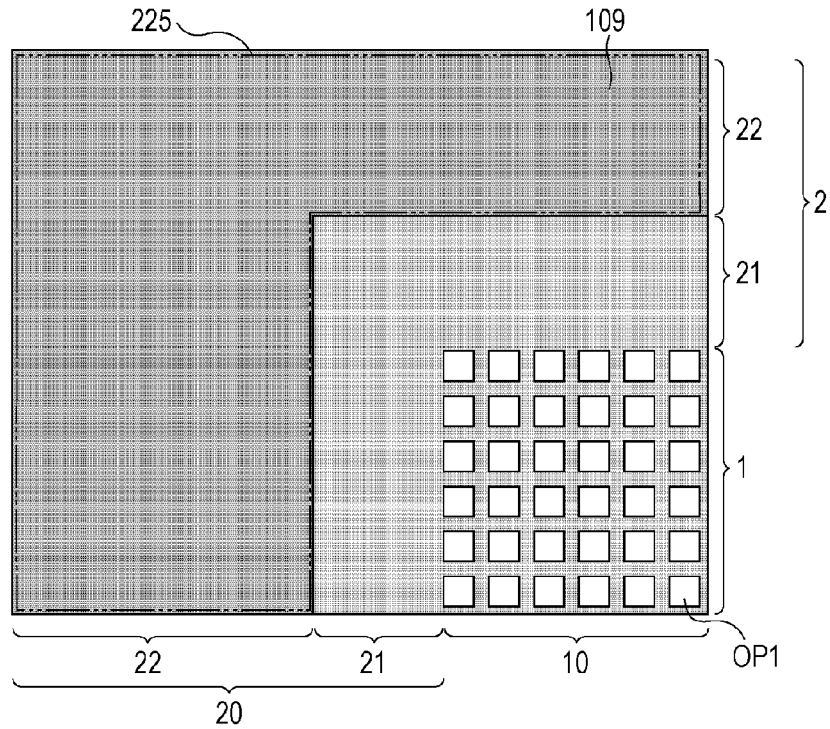

IMAGING DEVICE AND IMAGING SYSTEM

BACKGROUND OF THE INVENTION

1. Field of the Invention

The present invention relates to an imaging device and an imaging system, and more particularly relates to an imaging device and an imaging system having a light-sensing pixel region and a light-shielded pixel region.

2. Description of the Related Art

There are known imaging devices which have a light-sensing pixel region and a light-shielded pixel region. Japanese Patent Laid-Open No. 2010-267675 discloses an imaging device having a light-sensing pixel region, an invalid pixel region located on the outer side of the light-sensing pixel regions, and an optical black region (OPB region) located on the outer side of the invalid pixel region. Above the light-sensing pixel region, invalid pixel region, and OPB region, are formed wiring layers 1MT and 2MT. The wiring layers 1MT and 2MT have openings formed corresponding to photodiodes of individual pixels. Wiring layers 3MT and 4MT, which are formed further above the wiring layers 1MT and 2MT disposed above the light-sensing pixel region and invalid pixel region, are disposed above the OPB region, such that the wiring layers 3MT and 4MT shield incident light to the OPB region.

The imaging device disclosed in Japanese Patent Laid-Open No. 2010-267675 has openings formed in the wiring layers 1MT and 2MT formed above the light-sensing pixel region and invalid pixel region, at positions above the OPB region in the same way as for the light-sensing pixel region and invalid pixel region. Accordingly, at an OPB region adjacent to an invalid pixel region in particular, light diagonally input from the invalid pixel region toward the direction of the OPB region readily enters the OPB region. When light is entering the OPB region, signals when light is shielded (noise signals) cannot be correctly detected, so it becomes difficult to obtain accurate image signals. Also, it is desirable to reduce the optical path difference regarding incident light to each pixel in the light-sensing pixel regions, and to suppress unevenness in color, in order to obtain more accurate image signals.

SUMMARY OF THE INVENTION

It has been found desirable to suppress incident light into a light-shielded pixel region that has been shielded, from the side of a light-sensing pixel region, and also reduce the optical path difference regarding incident light to each pixel in the light-sensing pixel region.

An imaging device includes: a light-sensing pixel region; a first pixel region; a second pixel region; a first wiring layer disposed above the light-sensing pixel region; and a second wiring layer disposed above the topmost wiring layer of the wiring layer disposed above the light-sensing pixel region, above the second pixel region. The first pixel region is disposed between the light-sensing pixel region and the second pixel region, adjacent to the light-sensing pixel region and the second pixel region. The first pixel region overlaps, in plan view, a first shielding portion included in the first wiring layer. The second pixel region overlaps, in plan view, a second shielding portion included in the second wiring layer. An electroconductive pattern is formed at the first wiring layer at a position overlapping the second pixel region in plan view.

Further features of the present invention will become apparent from the following description of exemplary embodiments with reference to the attached drawings.

BRIEF DESCRIPTION OF THE DRAWINGS

FIGS. 3A and 3B are plan views of the imaging device according to the first embodiment.

DESCRIPTION OF THE EMBODIMENTS

First Embodiment

A first embodiment of the present invention will be described with reference to FIG. 1. Note that in the present Specification, portions which are not illustrated or described in particular should be understood to be known or public technology of the field applied thereto. The embodiments described here should be understood to be exemplary, and not restrictive.

Figure 1:
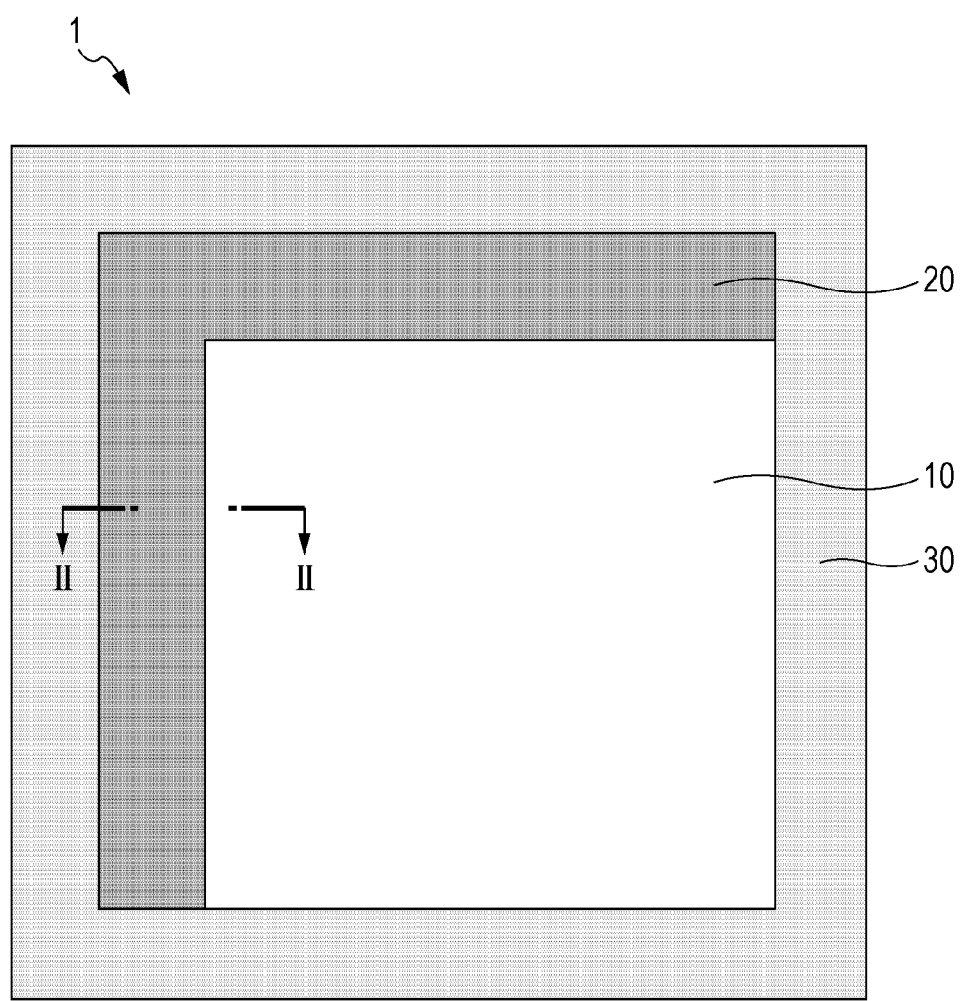
FIG. 1 is a diagram for describing an imaging device according to the present invention.

FIG. 1 is a plan layout diagram of an imaging device 1. The imaging device 1 in FIG. 1 includes a light-sensing pixel region 10, a light-shielded pixel region 20, and a peripheral circuit region 30. The light-shielded pixel region 20 is a region provided on the outer side of the light-sensing pixel region 10, and a two-dimensional array of multiple pixels is formed in the light-sensing pixel region 10 and light-shielded pixel region 20. The peripheral circuit region 30 is a region for controlling operations of the light-sensing pixel region 10 and for processing signals read from the light-sensing pixel region 10, and includes, for example, an amplifying circuit, a horizontal scan circuit, and a vertical scan circuit. Openings for each pixel are provided in a light-shielding film formed of a metal film above the light-sensing pixel region 10. The light-shielded pixel region 20 and peripheral circuit region 30 are covered by the light-shielding film when viewed from a direction perpendicular to the surface of a semiconductor substrate. At least part of the pixels in the light-shielded pixel region 20 are in an OPB region, and signals obtained in the OPB region are used as noise signals.

Figure 2:
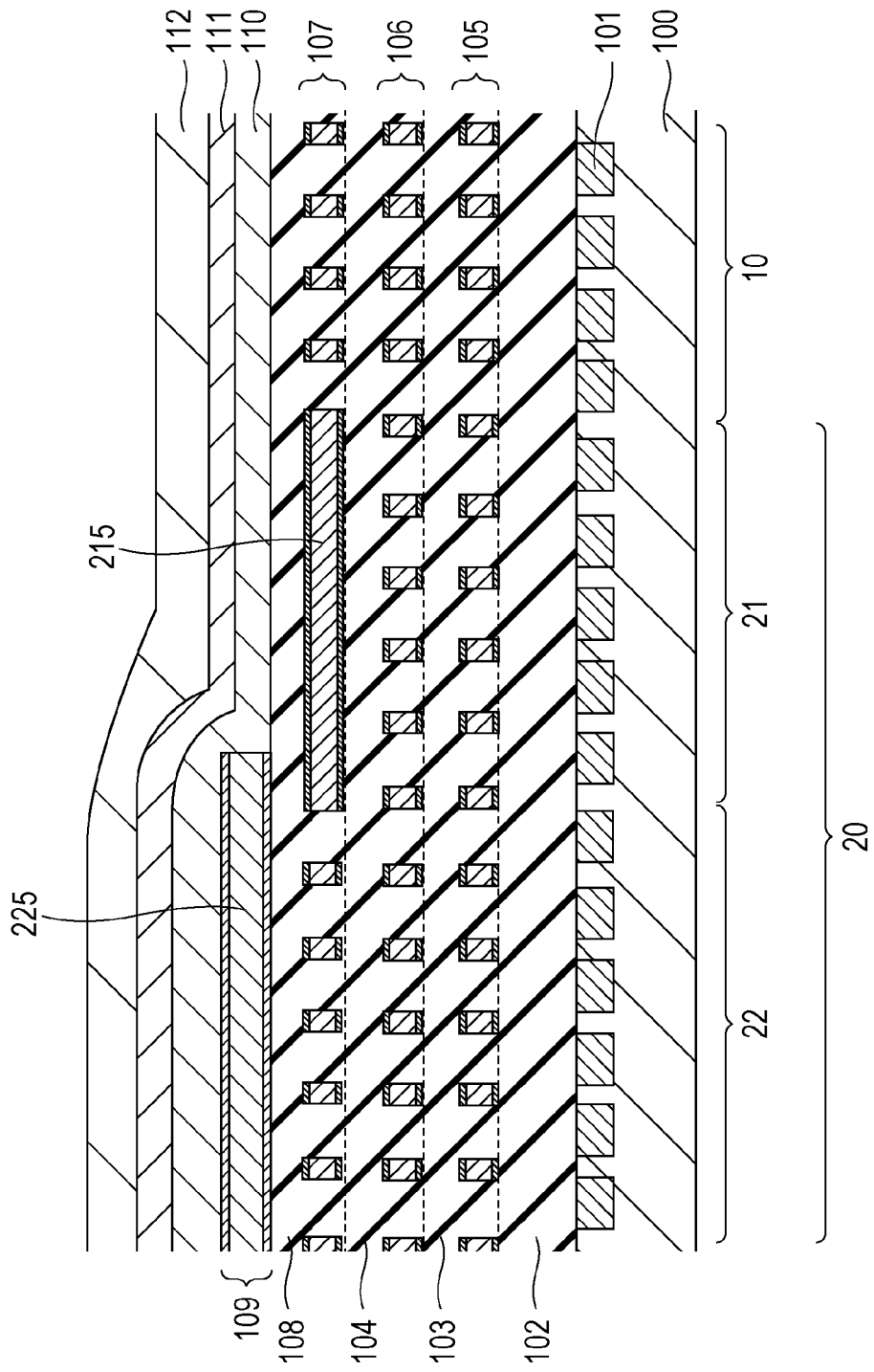
FIG. 2 is a cross-sectional view of an imaging device according to a first embodiment.

FIG. 2 is a cross-sectional view taken along II-II in the plan layout view in FIG. 1. As illustrated in FIG. 2, multiple photoelectric conversion units (hereinafter, also referred to as "PD units") 101 arrayed in row and column directions are provided on a semiconductor substrate (or simply "substrate") 100 in the light-sensing pixel region 10 and light-shielded pixel region 20. Metal-oxide semiconductor (MOS)

transistors provided on the semiconductor substrate 100 have been omitted from illustration, for sake of brevity of the drawings.

Note that in the following description, one pixel region means the smallest increment making up each of the light-sensing pixel region 10 and light-shielded pixel region 20. That is to say, one pixel region is the smallest-increment configuration repeatedly formed in the light-sensing pixel region 10 and light-shielded pixel region 20. Each pixel region includes a photoelectric conversion unit 101 formed on the substrate 100, and other components omitted from illustration such as gate electrode, charge sensing region, and so forth.

Formed above the semiconductor substrate 100 are a first wiring layer 105, a second wiring layer 106, a third wiring layer 107, and a fourth wiring layer 109, respectively interposed between an insulating film 102, an insulating film 103, an insulating film 104, and an insulating film 108. Metal plugs connecting the wiring layers have been omitted from illustration, for sake of brevity of the drawings. The insulating film 102, insulating film 103, insulating film 104, and insulating film 108 are formed of silicon oxide films, for example. The first wiring layer 105, second wiring layer 106, third wiring layer 107, and fourth wiring layer 109 are formed of a metal having aluminum or copper as the principal component, or an electroconductive intermetallic compound, for example. A barrier film of titanium nitride is preferably formed above and below these electroconductive materials. Disposed above the light-sensing pixel region 10 are the first wiring layer 105, second wiring layer 106, and third wiring layer 107. On the other hand, disposed above the light-shielded pixel region 20 are the first wiring layer 105, second wiring layer 106, third wiring layer 107, and additionally, the fourth wiring layer 109. The fourth wiring layer 109 is not disposed above the light-sensing pixel region 10. The film thickness of the fourth wiring layer 109 is greater than that of the first wiring layer 105 and second wiring layer 106. More preferably, the film thickness of the fourth wiring layer 109 is greater than that of the third wiring layer 107.

The fourth wiring layer 109 is covered by a passivation film (hereinafter, also "PV film") 110. A PV film is configured including a silicon oxynitride film, a silicon nitride film, or a layered film of these. One example of a layered film is a configuration obtained by layering, in order from bottom up, a silicon oxynitride film, a silicon nitride film, and a silicon oxynitride film. The PV film 110 is provided extending from the light-sensing pixel region 10 to the light-shielded pixel region 20, the position of the top face thereof being different above the fourth wiring layer 109 and the third wiring layer 107. That is to say, the PV film 110 is a conformal film which has a top face conforming to the shape of the fourth wiring layer 109. The PV film 110 is thinner than the fourth wiring layer 109.

A planarizing film 111 is formed above the PV film 110, and thereabove is formed a color filter layer 112. The color filter layer 112 has been simplified in the illustration, and in reality is configured including multiple predetermined color filters disposed for each pixel, so as to transmit only light of predetermined wavelengths.

The light-shielded pixel region 20 according to the present embodiment includes a first light-shielded pixel region 21 and a second light-shielded pixel region 22. The second light-shielded pixel region 22 is a region provided further outward from the light-sensing pixel region 10 and first light-shielded pixel region 21. In other words, the first light-shielded pixel region 21 is disposed between the light-sensing pixel region 10 and second light-shielded pixel region 22, and adjacent to the light-sensing pixel region 10 and second light-shielded pixel region 22.

The first light-shielded pixel region 21 is shielded by a first shielding portion 215 provided to the third wiring layer 107. The second light-shielded pixel region 22 is shielded by a second shielding portion 225 provided to the fourth wiring layer 109. The first shielding portion 215 may be provided to the first wiring layer 105 or second wiring layer 106, other than the third wiring layer 107. The first shielding portion 215 according to the present embodiment is provided to one of the first wiring layer 105, second wiring layer 106, and third wiring layer 107, disposed on the light-sensing pixel region 10. On the other hand, the second shielding portion 225 is provided to the fourth wiring layer 109, which is disposed above all of the wiring layers disposed on the light-sensing pixel region 10.

FIGS. 3A and 3B are diagrams where a part of the plan view layout in FIG. 1 has been enlarged and illustrated in further detail. The third wiring layer 107 is illustrated in FIG. 3A, showing the planar positional relationship between the third wiring layer 107, the light-sensing pixel region 10, the first light-shielded pixel region 21, and the second light-shielded pixel region 22.

With regard to the third wiring layer 107, an opening OP1 which restricts regions which can transmit incident light is formed at each light-sensing pixel disposed in the light-sensing pixel region 10, at a region positioned above the light-sensing pixel region 10. Forming the opening OP1 enables incident light to the semiconductor substrate 100 from a diagonal direction to be suppressed from entering adjacent light-sensing pixels.

Now, the present embodiment has an electroconductive pattern (opening OP2) having the same shape as the openings OP1 formed in a region located above the light-sensing pixel region 10, above the second light-shielded pixel region 22 in the third wiring layer 107 as well. The term "above" here means directly above each region. That is to say, the openings OP1 are formed such that, when viewing each PD unit 101 included in the light-sensing pixel region 10 from a direction perpendicular to the light receiving surface, each PD unit 101 and each opening OP1 appear to be situated at the same region. In the same way with the openings OP2 as well, when viewing each PD unit 101 included in the light-sensing pixel region 10 from a direction perpendicular to the light receiving surface, each PD unit 101 included in the second light-shielded pixel region 22 and each opening OP2 appear to be situated at the same region. Forming the electroconductive pattern above the second light-shielded pixel region 22 enables the difference in aperture area rate above the light-sensing pixel region 10 and above the entire light-shielded pixel region 20 to be reduced as compared to a case where no electroconductive pattern is formed above the second light-shielded pixel region 22. Reducing the difference in aperture area rate above the light-sensing pixel region 10 and above the entire light-shielded pixel region 20 allows the difference in film thickness of the interlayer insulating film 108 above the light-sensing pixel region 10 and above the light-shielded pixel region 20 to be reduced. Thus, the film thickness distribution of the interlayer insulating film 108 in the region situated above the light-sensing pixel region 10 can be improved. This is because that in a case where the difference in the aperture area rate in the region above the light-sensing pixel region 10 and above the light-shielded pixel region 20 is great, the planarization process using chemical mechanical polishing (CMP) at the time of forming the interlayer insulating film 108 generates a global film thickness gradient from the light-shielded pixel region 20 toward the light-sensing pixel region 10. The polishing rate of CMP in the palanrization process is fast in regions where wiring density is low, and is slow in regions where the wiring density is high. In a case where the film thickness difference of the interlayer insulating film 108 between above the light-shielded pixel region 20 and above the light-sensing pixel region 10 is great due to variation in the CMP polishing rate, the film thickness distribution above within the light-sensing pixel region 10 may be poor. As a result, the difference in optical path length of the multiple pixels included in the light-sensing pixel region 10 increases, and unevenness in color occurs more readily. The present invention addresses this issue by forming the openings OP2 at the third wiring layer 107, thus reducing in-plane global film thickness distribution of the interlayer insulating film 108. Reducing the global film thickness distribution enables the layer thickness distribution of the insulating film 108 to be reduced in the region above the light-sensing pixel region 10 as well.

With regard to the third wiring layer 107, openings are not formed at a region located above the first light-shielded pixel region 21, and a part of the wiring pattern included in the third wiring layer 107 functions as the first shielding portion 215 shielding the first light-shielded pixel region 21. That is to say, when viewed from a direction perpendicular to the light receiving surface of each PD unit 101 included in the light-sensing pixel region 10, the first light-shielded pixel region 21 and the first shielding portion 215 appear overlaid. Incident light toward the first light-shielded pixel region 21 is shielded by the first shielding portion 215 provided to the third wiring layer 107.

Next, FIG. 3B illustrates a plan view in which up to the fourth wiring layer 109 has been disposed. A part of the second shielding portion 225 at the fourth wiring layer 109 is indicated by being surrounded by a two-dot dashed line. The fourth wiring layer 109 is disposed in a region located above the second light-shielded pixel region 22, as illustrated in FIG. 3B. The fourth wiring layer 109 has the second shielding portion 225 which shields a region where the opening OP2 are formed at the third wiring layer 107. Accordingly, the incident light to the pixels included in the second light-shielded pixel region 22 is shielded by the second shielding portion 225 provided at the fourth wiring layer 109. That is to say, when viewed from a direction perpendicular to the light receiving surface of each PD unit 101 included in the light-sensing pixel region 10, the second light-shielded pixel region 22 and the second shielding portion 225 appear overlaid.

The first shielding portion 215 and the second shielding portion 225 are provided such that a part overlaps when viewed in plan view, i.e., from a direction perpendicular to the surface of the substrate 100. The amount of incident light to the light-shielded pixel region 20 from gaps between the first shielding portion 215 and second shielding portion 225 can be reduced by at least part of the first shielding portion 215 and second shielding portion 225 overlapping.

In the present invention, the second light-shielded pixel region 22 which is further away from the light-sensing pixel region 10 than the first light-shielded pixel region 21 is shielded by the second shielding portion 225 included in the fourth wiring layer 109. That is to say, of the multiple wiring layers provided above the light-sensing pixel region 10, the third wiring layer 107 is located at the topmost position, and the fourth wiring layer 109 which is located above the third wiring layer 107 is used to shield the second light-shielded pixel region 22. On the other hand, the first light-shielded pixel region 21 adjacent to the light-sensing pixel region 10 is shielded by the first shielding portion 215 provided to the third wiring layer 107 located above the light-sensing pixel region 10. Thus, the amount of diagonal incident light from the light-sensing pixel region 10 toward the first light-shielded pixel region 21 can be reduced by shielding the first light-shielded pixel region 21 adjacent to the light-sensing pixel region 10 using a wiring layer lower than the other light-shielded pixel regions. Also, providing the first light-shielded pixel region 21 between the second light-shielded pixel region 22 and the light-sensing pixel region 10 enables the effects on the light-sensing pixel region 10 of any stepped portion, formed on the top face by the second shielding portion 225 provided to the second light-shielded pixel region 22, to be reduced.

While the first shielding portion 215 has been provided to the third wiring layer 107 in the present embodiment, this may be provided to the first wiring layer 105 or second wiring layer 106 as well. Also, the second shielding portion 225 has been described as being provided to the fourth wiring layer 109 adjacent to the third wiring layer 107 in the vertical direction as to the surface of the substrate 100. However, an arrangement may be made where a wiring layer is formed further above the fourth wiring layer 109, and the second shielding portion 225 is formed at this wiring layer formed further above the fourth wiring layer 109.

Also, an arrangement may be made where the above-described light-shielded pixel region 20 is shielded by a shielding portion formed further above the first shielding portion 215 and second shielding portion 225. In this case as well, the amount of diagonally incident light toward the first light-shielded pixel region 21 can be reduced by having the first shielding portion 215 and second shielding portion 225, and film thickness distribution of the interlayer insulating film 108 can be improved.

Figure 4:
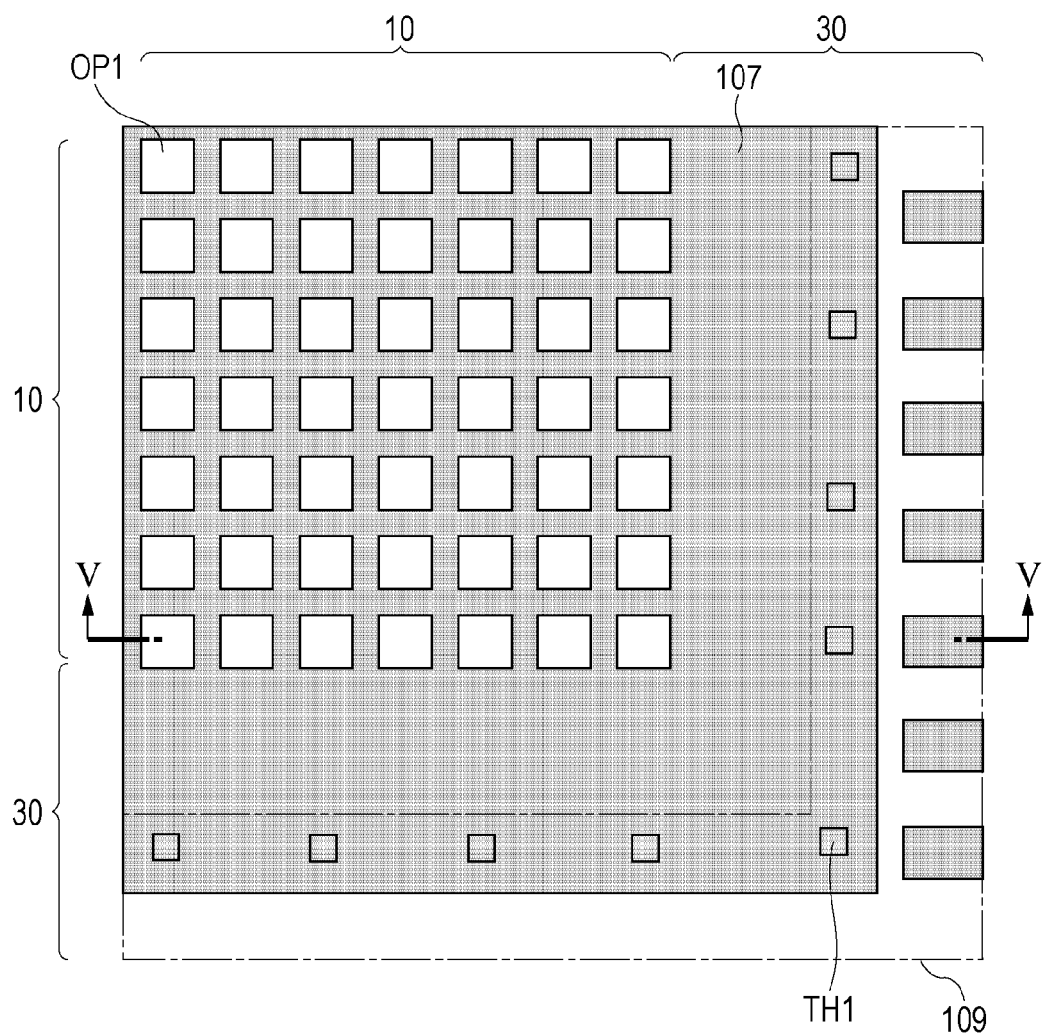
FIG. 4 is a plan view for describing the peripheral region of the imaging device according to the present invention.
Figure 5:
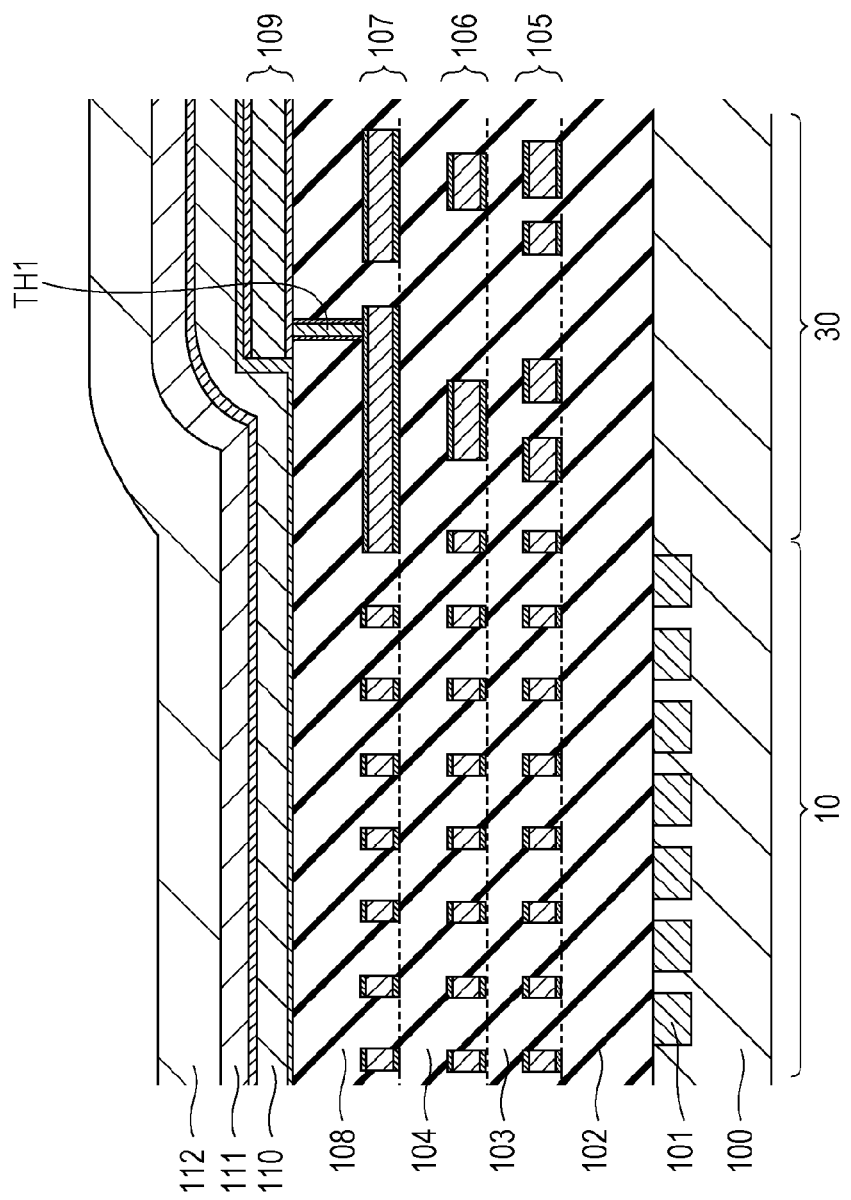
FIG. 5 is a cross-sectional view for describing the peripheral region of the imaging device according to the present invention.

Next, the peripheral circuit region 30 disposed around the light-sensing pixel region 10 and light-shielded pixel region 20 will be described with reference to FIGS. 4 and 5. FIG. 4 is a plan view where the light-sensing pixel region 10 and peripheral circuit region 30 are enlarged. FIG. 5 is a cross-sectional view taken along V-V in FIG. 4.

FIG. 4 illustrates the third wiring layer 107, the fourth wiring layer 109, and a through-hole TH1 in which a plug is disposed to electrically connect the third wiring layer 107 and fourth wiring layer 109. FIG. 4 also illustrates the planar positional relationship of the third wiring layer 107 and fourth wiring layer 109, and the light-sensing pixel region 10, first light-shielded pixel region 21, and second light-shielded pixel region 22. The region where the fourth wiring layer 109 is located is indicated by a single-dot dashed line, to explain the planar positional relationship between the third wiring layer 107 and the fourth wiring layer 109. No PD units 101 are formed in the peripheral circuit region 30. Disposed in the peripheral circuit region 30 are, for example, a vertical drive circuit, column signal processing circuit, horizontal drive circuit, output circuit, control circuit, and so forth. Although not illustrated here, the peripheral circuit region 30 has disposed therein transistor source regions, drain regions, and so forth, making up the peripheral circuits.

Second Embodiment

A second embodiment of the present invention will be described now. Structures and regions having similar functions to those in the first embodiment will be denoted with the same reference numerals, and description thereof may be omitted as appropriate.

Figure 6:
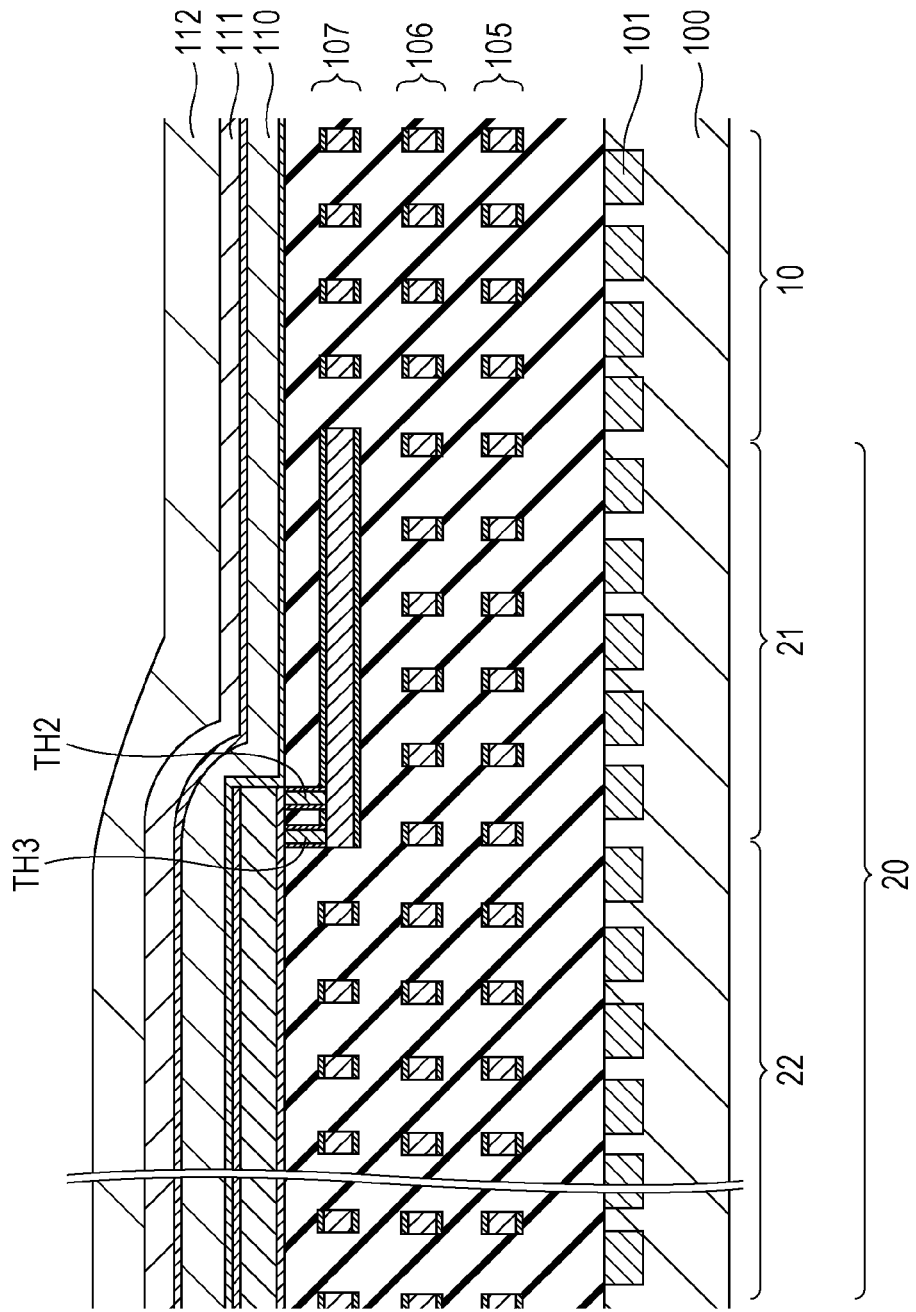
FIG. 6 is a cross-sectional view of an imaging device according to a second embodiment.

The second embodiment according to the present invention will be described with reference to FIG. 6. The first shielding portion 215 is provided to the third wiring layer 107 and the second shielding portion 225 is provided to the fourth wiring layer 109, in the same way as with the first embodiment. The present embodiment differs from the first embodiment in that a through-hole is formed at positions where the first shielding portion 215 and second shielding portion 225 overlap in planar view. Two through-holes, TH2 and TH3, are formed between the first shielding portion 215 and second shielding portion 225. The through-hole TH2 is provided on the inner side as to the through-hole TH3, that is to say, on the light-sensing pixel region 10 side. The through-holes are formed of tungsten for example, and electrically connect the first shielding portion 215 and second shielding portion 225. The tungsten within the through-holes may be covered with a barrier film such as TiN or the like, to prevent the tungsten from diffusing into the interlayer insulating films. The third wiring layer 107 and fourth wiring layer 109 may be designed so as to be of the same potential at this time, due to having been electrically connected by the through-holes TH2 and TH3.

Figure 7:
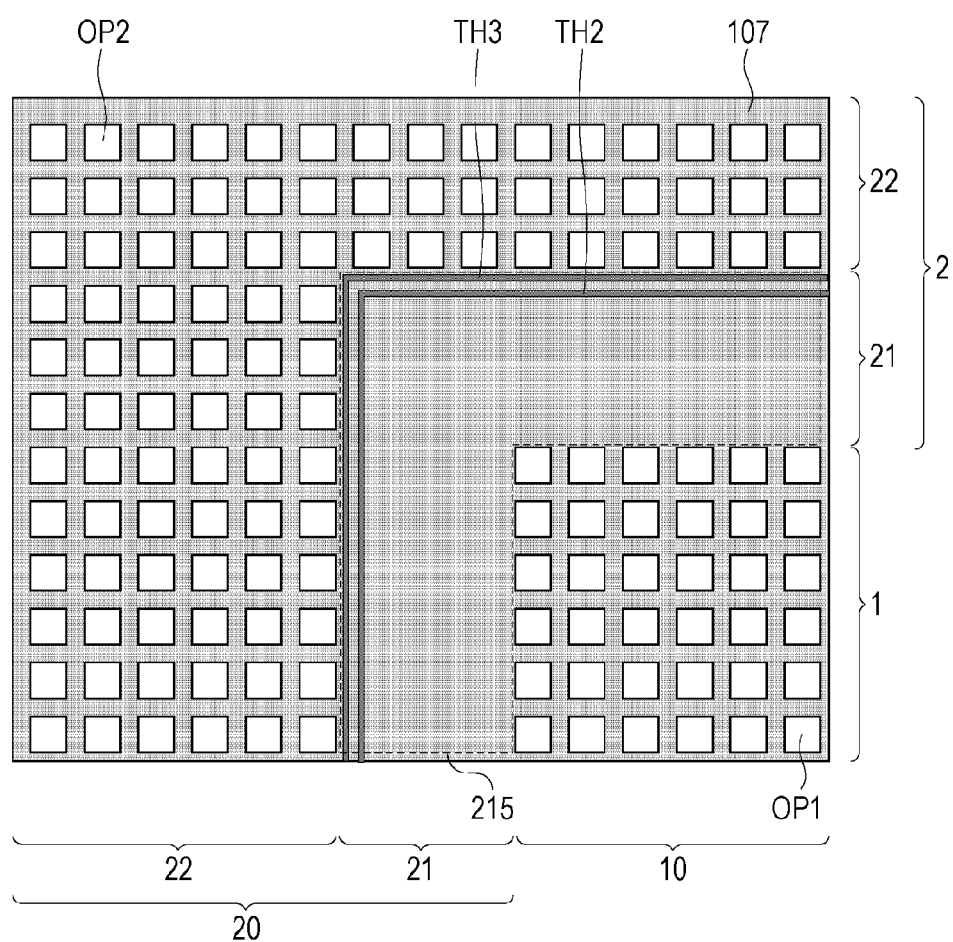
FIG. 7 is a plan view of the imaging device according to the second embodiment.

FIG. 7 is a plan view of the present embodiment. Only the third wiring layer 107 and the through-holes TH2 and TH3 formed on the third wiring layer 107 are illustrated. The through-holes TH2 and TH3 are uninterruptedly and continuously formed in the planar direction, above the boundary region between the first light-shielded pixel region 21 and second light-shielded pixel region 22. Forming the through-holes above the boundary region between the first light-shielded pixel region 21 and second light-shielded pixel region 22 enables incident light from between the first light-shielded pixel region 21 and second light-shielded pixel region 22 to be shielded in a sure manner.

Third Embodiment

Figure 8:
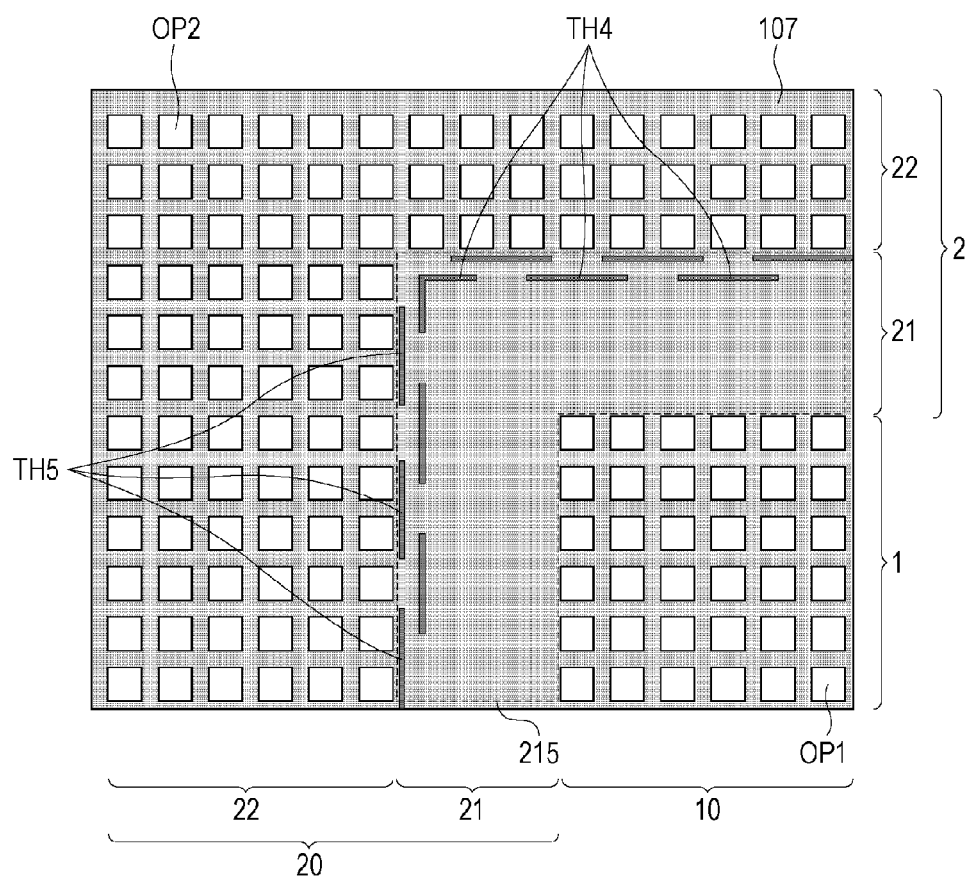
FIG. 8 is a cross-sectional view of an imaging device according to a third embodiment.

A third embodiment of the present invention will be described with reference to FIG. 8. FIG. 8 is a plan view of the present embodiment, illustrating only the third wiring layer 107 and the through-holes formed on the third wiring layer 107. Through-holes TH4 and TH5 formed between the first shielding portion 215 and second shielding portion 225 are not continuous in the plane direction, being partly discontinued in the present embodiment. However, the through-holes TH4 and TH5 are formed in an alternately continuous manner in the row direction or column direction above the boundary region between the first light-shielded pixel region 21 and the second light-shielded pixel region 22. Accordingly, the region above the second light-shielded pixel region 22 is not visible when viewed from positions above the light-sensing pixel region 10 in the third wiring layer 107.

In an arrangement where the through-holes are a continuous structure in the plane direction, as illustrated in the second embodiment, the area of the interlayer insulating film 108 as to the area of the through-holes is small when filling the through-holes with metal and polishing by CMP. Accordingly, great force applied on the insulating film 108 at the time of removing the metal filled in the through-holes may result in the insulating film 108 near the region where the through-holes are formed being excessively ground down. The thickness of an interlayer insulating film in a region which has been excessively ground down is thinner than the interlayer insulating film at other regions. Having regions where the interlayer insulating film is thin above the light-sensing pixel region 10 causes optical path difference at each point in the incident light to the light-sensing pixel region 10.

According to the present embodiment, incident light from gaps between the first shielding portion 215 and second shielding portion 225 to the second light-shielded pixel region 22 can be suppressed while reducing the area of through-holes in the planar direction. In other words, at the time of forming openings in the interlayer insulating film 108, filling with metal, and polishing by CMP, the area of the interlayer insulating film 108 as to the area of through-holes can be larger. As a result, the amount of pressure on the interlayer insulating film 108 can be reduced at the time of removing the metal filled in the through-holes, and excessive grinding of the interlayer insulating film 108 near the regions where the through-holes are formed can be suppressed.

Fourth Embodiment

Figure 9:
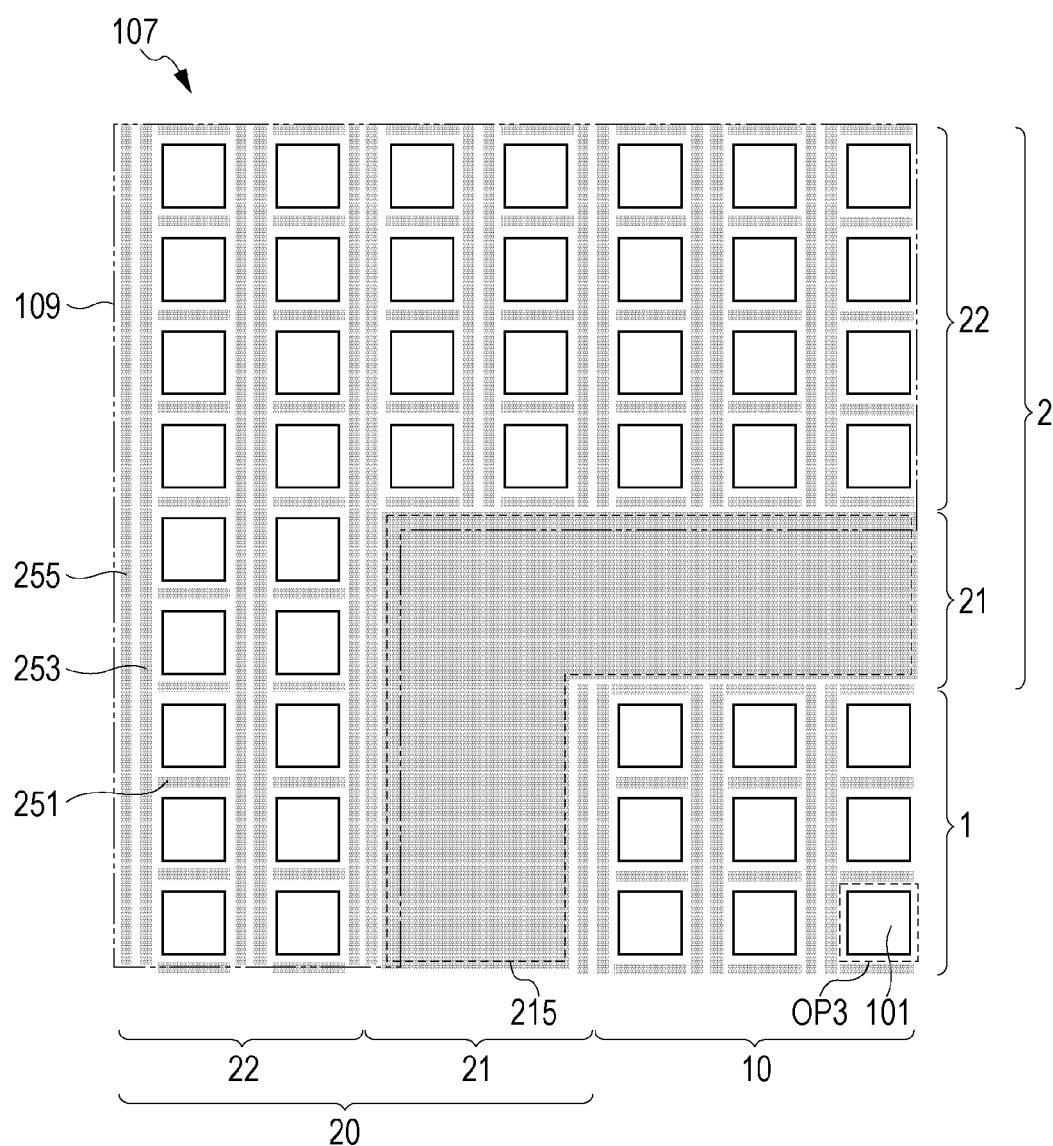
FIG. 9 is a plan view of the imaging device according to a fourth embodiment.

A fourth embodiment of the present invention will be described with reference to FIG. 9. FIG. 9 is a plan view of the present embodiment, illustrating the third wiring layer 107 and the fourth wiring layer 109. The fourth wiring layer 109 is indicated by a two-dot dashed line, to indicate the planar positional relationship between the third wiring layer 107 and fourth wiring layer 109.

In the above-described first through third embodiments, rectangular openings regulating the regions through which light is transmitted are formed at the third wiring layer 107, to restrict incident light to the PD units 101. Conversely, incident light to the PD units 101 is restricted in the present embodiment by openings regulating the regions through which light is transmitted being formed by multiple wires. Pixel output lines 253, power supply lines 255, and dummy wiring 251, are provided in the region positioned above the light-sensing pixel region 10 and the region positioned above the second light-shielded pixel region 22. The pixel output lines 253 are lines to output signals from the PD units 101 to the peripheral circuit region 30. The power supply lines 255 are lines to apply voltage to gate electrodes in order to read out the signal charges accumulated at the PD units 101. The dummy wiring 251 does not have roles such as signal transfer or voltage application, but has been provided to regulate openings OP3 for the PD units 101. Note that the functions of the wiring are exemplary, and an arrangement may be made where the wiring regulating regions through which incident light to the PD units passes have other functions.

In the above-described first through third embodiments, rectangular openings are formed at the region above the light-sensing pixel region 10 in the third wiring layer 107. Openings having the same shape as the openings formed in the region positioned above the light-sensing pixel region 10 are also formed in the region positioned above the second light-shielded pixel region 22. Conversely, in the present embodiment, openings, regulating regions through which incident light to the PD units 101 is transmitted, are formed of multiple wires in a region positioned above the light-sensing pixel region 10. Further, a pattern the same as the wiring pattern formed above the light-sensing pixel region 10 is also formed in the region of the third wiring layer 107 positioned above the second light-shielded pixel region 22.

Thus, the same pattern is preferably formed at the third wiring layer 107 in both the region positioned above the light-sensing pixel region 10 and the region positioned above the second light-shielded pixel region 22. The reason is that this enables the difference in aperture area rate above the light-sensing pixel region 10 and above the light-shielded pixel region 20 to be reduced in the third wiring layer 107.

Figure 10:
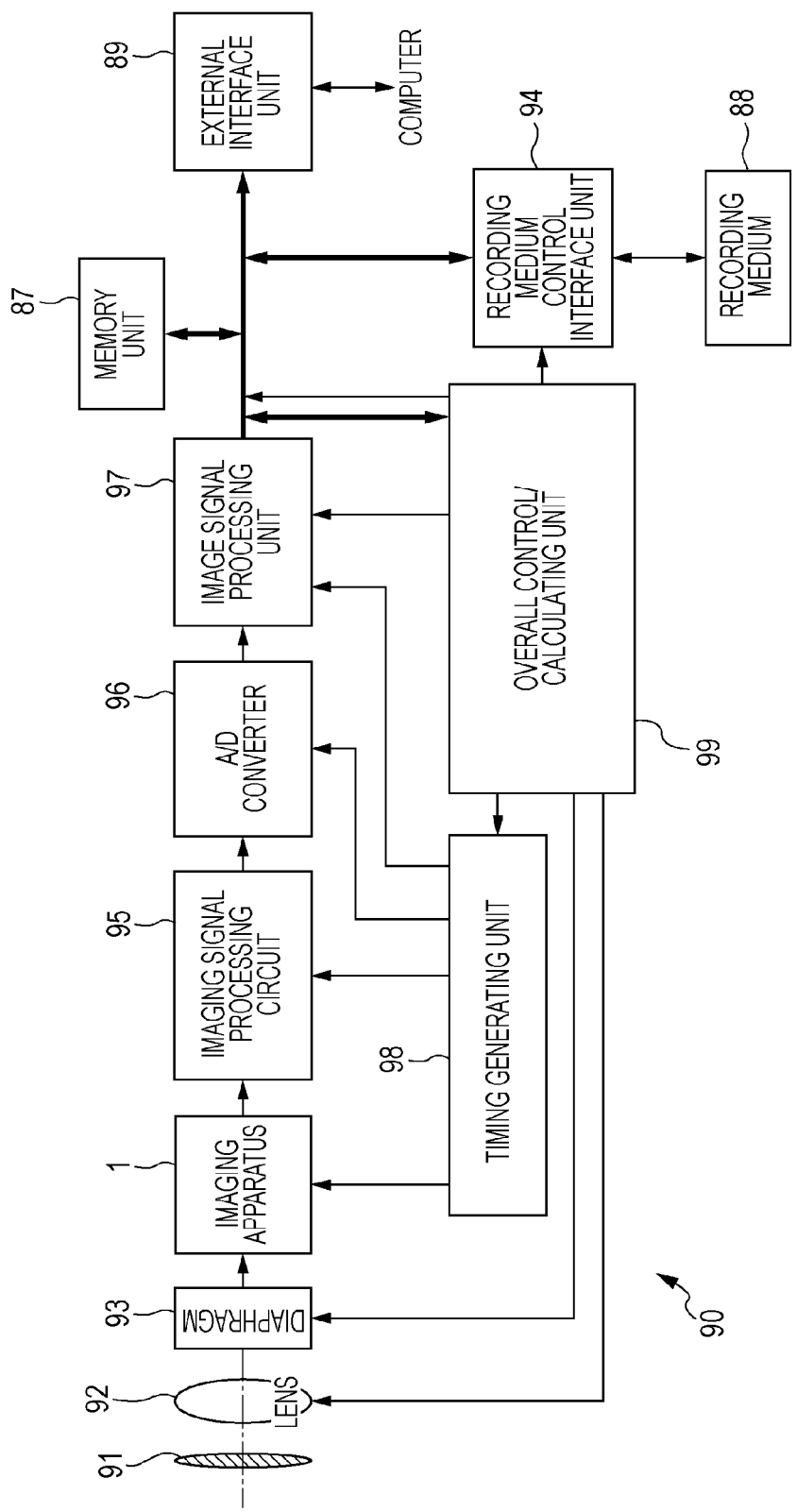
FIG. 10 is a diagram for describing an imaging system using the imaging device according to the present invention.

Next, FIG. 10 illustrates an example of an imaging system using an imaging device according to the above-described embodiments. As illustrated in FIG. 10, an imaging system 90 primarily includes an optical system, the imaging device 1 according to the above-described embodiments, and a signal processing unit. The optical system primarily includes a shutter 91, a lens 92, and a diaphragm 93. The signal processing unit primarily includes an imaging signal processing circuit 95, an A/D converter 96, an imaging signal processing unit 97, a memory unit 87, an external interface unit 89, a timing generating unit 98, an overall control/calculating unit 99, a recording medium 88, and a recording medium control interface unit 94. Note that the recording medium 88 does not have to be provided to the signal processing unit. The shutter 91 is disposed in front of the lens 92 on the optical path, and controls exposure. The lens 92 refracts incident light and forms an image of a subject on an imaging plane of the imaging device 1. The diaphragm 93 is interposed between the lens 92 and a photodetector (PD) region on the optical axis, so as to adjust the amount of light guided to the PD region after having passed through the lens 92. The PD region of the imaging device 1 converts the subject image formed at the imaging plane into image signals. The imaging device 1 reads out the image signals from the PD region and outputs the image signals. The imaging signal processing circuit 95 is connected to the imaging device 1, and processes image signals output from the imaging device 1. The A/D converter 96 is connected to the imaging signal processing circuit 95, and converts the post-processing image signals (analog signals) output from the imaging signal processing circuit 95, into image signals (digital signals). The image signal processing unit 97 is connected to the A/D converter 96, and image signals (digital signals) output from the A/D converter 96 are subjected to various types of arithmetic operation processing such as correction and so forth, thus generating image data. This image data is supplied to the memory unit 87, external interface unit 89, overall control/calculating unit 99, and recording medium control interface unit 94. The memory unit 87 is connected to the imaging signal processing unit 97, and stores image data output from the imaging signal processing unit 97. The external interface unit 89 is connected to the imaging signal processing unit 97, and thus image data output from the imaging signal processing unit 97 is transferred to an external device (personal computer or the like) via the external interface unit 89. The timing generating unit 98 is connected to the imaging device 1, imaging signal processing circuit 95, A/D converter 96, and imaging signal processing unit 97, and thus supplies timing signals to the imaging device 1, imaging signal processing circuit 95, A/D converter 96, and imaging signal processing unit 97. The imaging device 1, imaging signal processing circuit 95, A/D converter 96, and imaging signal processing unit 97 operate synchronously with the timing signals. The overall control/calculating unit 99 is connected to the timing generating unit 98, imaging signal processing unit 97, and recording medium control interface unit 94, and thus centrally controls the timing generating unit 98, imaging signal processing unit 97, and recording medium control interface unit 94. The recording medium 88 is detachably connected to the recording medium control interface unit 94. Thus image data output from the imaging signal processing unit 97 is recorded in the recording medium 88 via the recording medium control interface unit 94.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-267139, filed Dec. 25, 2013, which is hereby incorporated by reference herein in its entirety.

What is claimed is:

1. An imaging device comprising:
a light-sensing pixel region;
a first pixel region;
a second pixel region;
a first wiring layer disposed above the light-sensing pixel region;
a second wiring layer disposed above the topmost wiring layer of the wiring layer disposed above the light-sensing pixel region, above the second pixel region; and
a passivation film disposed extending from the light-sensing pixel region to the first pixel region and the second pixel region, of which a position of a top face located above the second wiring layer differs from a position of a top face located above the first wiring layer,
wherein the first pixel region is disposed between the light-sensing pixel region and the second pixel region, adjacent to the light-sensing pixel region and the second pixel region,
wherein the first pixel region overlaps, in plan view, a first shielding portion included in the first wiring layer,
wherein the second pixel region overlaps, in plan view, a second shielding portion included in the second wiring layer,
and wherein an electroconductive pattern is formed at the first wiring layer at a position overlapping the second pixel region in plan view.

2. The imaging device according to claim 1,
wherein the first shielding portion and the second shielding portion partially overlap each other in plan view.

3. The imaging device according to claim 1,
wherein a plurality of wiring layers are disposed above the light-sensing pixel region,
and wherein the first wiring layer is located at the topmost position of the plurality of wiring layers.

4. The imaging device according to claim 1,
wherein the first wiring layer and second wiring layer are adjacent to each other in a direction perpendicular to a light receiving surface of the light-sensing pixel region.

5. The imaging device according to claim 4,
wherein a through-hole is formed between the first wiring layer and the second wiring layer in at least a part of a region where the first shielding layer and the second shielding layer overlap in plan view.

6. The imaging device according to claim 5,
wherein the first shielding portion and the second shielding portion are electrically connected by a plug filled in the through-hole.

7. The imaging device according to claim 1,
wherein the first wiring layer has a predetermined pattern in a region located above the light-sensing pixel region, and also has the predetermined pattern in at least part of a region overlapping the second pixel region in plan view.

8. The imaging device according to claim 7,
wherein the predetermined pattern which the first wiring layer has is a pattern for regulating an opening for incident light as to the light-sensing pixel region, the first wiring layer having a shape the same as the predetermined pattern in a region overlapping the second pixel region in plan view.

9. The imaging device according to claim 1,
wherein the second wiring layer is not disposed in a region overlapping the first pixel region in plan view.

10. The imaging device according to claim 1,
wherein the first pixel region and the second pixel region include an optical black pixel.

11. The imaging device according to claim 1,
wherein an interlayer insulating film is disposed above the first wiring layer,
and wherein the interlayer insulating film has been polished by chemical mechanical polishing.

12. An imaging system comprising:
the imaging device according to claim 1;
an optical system configured to form an image at the light-sensing pixel region of the imaging device; and
a signal processing unit configured to generate image data by processing signals output from the imaging device.

\* \* \* \* \*